United States Patent
Al Madani et al.

(10) Patent No.: US 11,734,603 B2
(45) Date of Patent: Aug. 22, 2023

(54) METHOD AND SYSTEM FOR ENHANCING ARTIFICIAL INTELLIGENCE PREDICTIONS USING WELL DATA AUGMENTATION

(71) Applicant: SAUDI ARABIAN OIL COMPANY, Dhahran (SA)

(72) Inventors: Mohammed Al Madani, Dhahran (SA); Marei Al Garni, Dhahran (SA); Maan Al Hawi, Dhahran (SA); Mohammed Al Amoudi, Dhahran (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 617 days.

(21) Appl. No.: 16/831,211

(22) Filed: Mar. 26, 2020

(65) Prior Publication Data
US 2021/0304060 A1    Sep. 30, 2021

(51) Int. Cl.
*G06N 20/00*    (2019.01)
*G06F 30/27*    (2020.01)
(Continued)

(52) U.S. Cl.
CPC ........... *G06N 20/00* (2019.01); *G01V 99/005* (2013.01); *G06F 30/27* (2020.01); *G06N 5/02* (2013.01); *G06N 5/04* (2013.01)

(58) Field of Classification Search
CPC ............... G06N 20/00; G01V 2200/16; G01V 2210/66; G01V 5/12; G01V 2210/3246;
(Continued)

(56) References Cited

U.S. PATENT DOCUMENTS

| 5,345,077 A | 9/1994 | Allen et al. |
| 2015/0300151 A1 | 10/2015 | Mohaghegh |

(Continued)

FOREIGN PATENT DOCUMENTS

| CN | 109447249 A | 3/2019 |
| CN | 109828304 A | 5/2019 |

(Continued)

OTHER PUBLICATIONS

Kanfar, Rayan; Shaikh, Obai; Yousefzadeh, Mehrdad; and Mukerji, Tapan: "Real-Time Well Log Prediction From Drilling Data Using Deep Learning." Paper presented at the International Petroleum Technology Conference, Dhahran, Kingdom of Saudi Arabia, Jan. 2020. (Year: 2020).*

(Continued)

*Primary Examiner* — Rutao Wu
*Assistant Examiner* — Sarjits Bains
(74) *Attorney, Agent, or Firm* — Osha Bergman Watanabe & Burton LLP

(57) ABSTRACT

A method may include obtaining first acquired well data. The method may further include generating augmented well data based on the first acquired well data. The augmented well data may be generated using a geological factor and a drilling factor. The method may further include generating a model using various machine-learning epochs and the first acquired well data and the augmented well data. The model may be trained by replicating a portion of the first acquired well data and the augmented well data during a machine-learning epoch among the machine-learning epochs. The method may further include generating adjusted well data for a region of interest using the model and second acquired well data.

17 Claims, 8 Drawing Sheets

(51) Int. Cl.
*G01V 99/00* (2009.01)
*G06N 5/02* (2023.01)
*G06N 5/04* (2023.01)

(58) Field of Classification Search
CPC ..... G01V 2210/614; G01V 2210/6169; G01V 2210/62; G01V 2210/624; G01V 2210/663; E21B 49/00; E21B 49/003; E21B 49/02; E21B 49/08; G06K 9/6256
See application file for complete search history.

(56) References Cited

U.S. PATENT DOCUMENTS

| | | | |
|---|---|---|---|
| 2017/0089846 A1* | 3/2017 | Guo | G01N 23/203 |
| 2019/0025461 A1* | 1/2019 | Wiener | G01V 99/005 |
| 2019/0147125 A1 | 5/2019 | Yu et al. | |
| 2019/0169986 A1 | 6/2019 | Storm, Jr. et al. | |
| 2020/0040719 A1* | 2/2020 | Maniar | G06N 20/00 |
| 2020/0158898 A1* | 5/2020 | Le Guern | G01V 1/345 |
| 2020/0183035 A1* | 6/2020 | Liu | G01V 1/345 |
| 2020/0301036 A1* | 9/2020 | Ramfjord | G01V 1/50 |
| 2022/0099855 A1* | 3/2022 | Li | G01V 1/345 |
| 2022/0170359 A1* | 6/2022 | Boualleg | G06N 20/20 |

FOREIGN PATENT DOCUMENTS

| | | |
|---|---|---|
| CN | 110397402 A | 11/2019 |
| WO | 2018232198 A1 | 12/2018 |
| WO | 2019055565 A1 | 3/2019 |
| WO | 2019/089490 A1 | 5/2019 |

OTHER PUBLICATIONS

Baneshi, M.; Behzadijo.M.; Schaffie, M; and Nezamabadi-Pour, H.: "Predicting Log Data by Using Artificial Neural Networks to Approximate Petrophysical Parameters of Formation", Petroleum Science and Technology, vol. 31, 1238-1248 (2013). (Year: 2013).*
International Search Report issued in corresponding International Application No. PCT/US2020/029838, dated Dec. 18, 2020 (3 pages).
Written Opinion issued in corresponding International Application No. PCT/US2020/029838, dated Dec. 18, 2020 (13 pages).
Fawaz, Hassan Ismail, et al. "Data augmentation using synthetic data for time series classification with deep residual networks." arXiv preprint arXiv: 1808.02455 (2018) (8 pages).
Le Guennec, Arthur, Simon Malinowski, and Romain Tavenard. "Data augmentation for time series classification using convolutional neural networks." 2016 (9 pages).
Glover, Paul. "Petrophysics MSc course notes." University of Leeds, UK (2000) (20 pages).

* cited by examiner

METHOD AND SYSTEM FOR ENHANCING ARTIFICIAL INTELLIGENCE PREDICTIONS USING WELL DATA AUGMENTATION

BACKGROUND

A subsurface formation may be determined using various measurements obtained through logging tools. For example, these measurements may be used to calculate porosity, permeability, and other properties of a reservoir formation. However, in many situations, logging tool measurements may prove inaccurate due to unusual conditions within a wellbore.

SUMMARY

In general, in one aspect, embodiments relate to a method that includes obtaining, by a computer processor, first acquired well data. The method further includes generating, by the computer processor, augmented well data based on the first acquired well data, wherein the augmented well data is generated using a geological factor and a drilling factor. The method further includes generating, by the computer processor, a model using various machine-learning epochs and the first acquired well data and the augmented well data. The model is trained by replicating a portion of the first acquired well data and the augmented well data during a machine-learning epoch among the machine-learning epochs. The method further includes generating, by the computer processor, adjusted well data for a region of interest using the model and second acquired well data.

In general, in one aspect, embodiments relate to a system that includes a logging system coupled to various logging tools. The system further includes a simulator including a computer processor, where the simulator is coupled to the logging system. The simulator obtains first acquired well data. The simulator further generates augmented well data based on the first acquired well data. The augmented well data is generated using a geological factor and a drilling factor. The simulator further generates a model using various machine-learning epochs and the first acquired well data and the augmented well data. The model is trained by replicating a portion of the first acquired well data and the augmented well data during a machine-learning epoch among the machine-learning epochs. The simulator further determines adjusted well data for a region of interest using the model and second acquired well data.

In general, in one aspect, embodiments relate to a non-transitory computer readable medium storing instructions executable by a computer processor. The instructions obtain first acquired well data. The instructions further generate augmented well data based on the first acquired well data. The augmented well data is generated using a geological factor and a drilling factor. The instructions further generate a model using various machine-learning epochs and the first acquired well data and the augmented well data. The model is trained by replicating a portion of the first acquired well data and the augmented well data during a machine-learning epoch among the machine-learning epochs. The instructions further determine adjusted well data for a region of interest using the model and second acquired well data.

Other aspects of the disclosure will be apparent from the following description and the appended claims.

BRIEF DESCRIPTION OF DRAWINGS

Specific embodiments of the disclosed technology will now be described in detail with reference to the accompanying figures. Like elements in the various figures are denoted by like reference numerals for consistency.

DETAILED DESCRIPTION

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as using the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments of the disclosure include systems and methods for generating and using a model that is trained using augmented well data. In particular, training a model with non-augmented well data may not capture the full range of geological and drilling scenarios involved in well data acquisition within a subsurface formation. Thus, to supplement ordinary well data, data augmentation processes provide the ability to expand the training dataset for a model while also incorporating adjustments within the well data to address the geological and drilling scenarios. For example, a well log may be deformed, shifted, cut, and have noise inserted into the well log in order to emulate various geological and drilling conditions experienced in acquired well log measurements.

Figure 1:
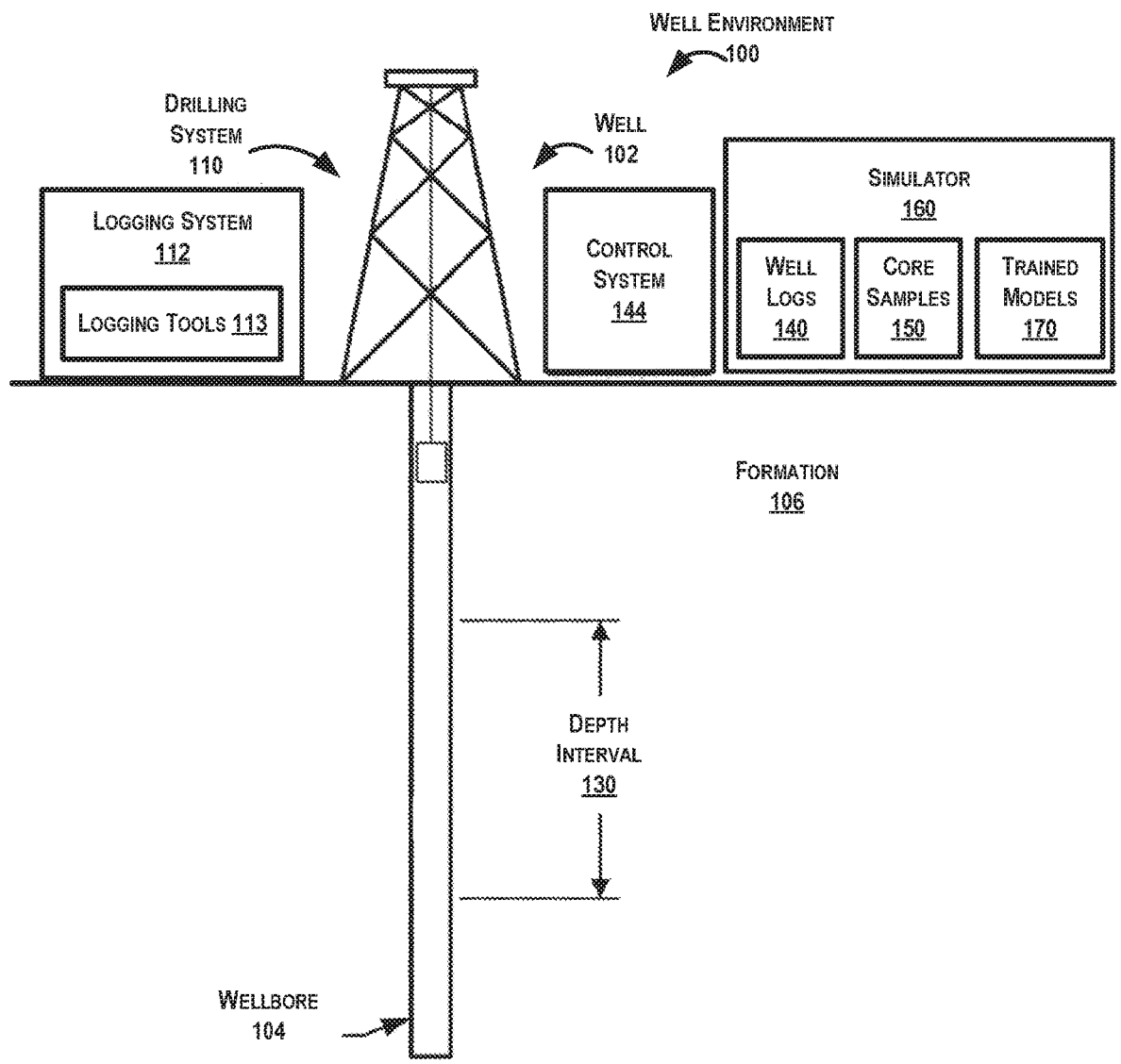
FIGS. 1, 2A, and 2B show systems in accordance with one or more embodiments.

Turning to FIG. 1, FIG. 1 shows a schematic diagram in accordance with one or more embodiments. As shown in FIG. 1, FIG. 1 illustrates a well environment (100) that may include a well (102) having a wellbore (104) extending into a formation (106). The wellbore (104) may include a bored hole that extends from the surface into a target zone of the formation (106), such as a reservoir. The formation (106) may include various formation characteristics of interest, such as formation porosity, formation permeability, resistivity, water saturation, free water level (FWL), and the like. Porosity may indicate how much space exists in a particular rock within an area of interest in the formation (106), where oil, gas, and/or water may be trapped. Permeability may indicate the ability of liquids and gases to flow through the rock within the area of interest. Resistivity may indicate how strongly rock and/or fluid within the formation (106) opposes the flow of electrical current. For example, resistivity may be indicative of the porosity of the formation (106) and the presence of hydrocarbons. More specifically, resistivity may be relatively low for a formation that has high porosity and a large amount of water. Resistivity may be relatively high for a formation that has low porosity or includes a large amount of hydrocarbons. Water saturation may indicate the fraction of water in a given pore space.

Keeping with FIG. 1, the well environment (100) may include a drilling system (110), a logging system (112), a control system (144), and a simulator (160). The drilling system (110) may include a drill string, drill bit, a mud circulation system and/or the like for use in boring the wellbore (104) into the formation (106). The control system (144) may include hardware and/or software for managing drilling operations and/or maintenance operations. For example, the control system (144) may include one or more programmable logic controllers (PLCs) that include hardware and/or software with functionality to control one or more processes performed by the drilling system (110). Specifically, a programmable logic controller may control valve states, fluid levels, pipe pressures, warning alarms, and/or pressure releases throughout a drilling rig. In particular, a programmable logic controller may be a ruggedized computer system with functionality to withstand vibrations, extreme temperatures, wet conditions, and/or dusty conditions, for example, around a drilling rig. Without loss of generality, the term "control system" may refer to a drilling operation control system that is used to operate and control the equipment, a drilling data acquisition and monitoring system that is used to acquire drilling process and equipment data and to monitor the operation of the drilling process, or a drilling interpretation software system that is used to analyze and understand drilling events and progress. For more information on an example of a drilling system, see FIGS. 2A and 2B below and the accompanying description.

The logging system (112) may include one or more logging tools (113), such as a nuclear magnetic resonance (NMR) logging tool and/or a resistivity logging tool, for use in generating well logs (140) of the formation (106). For example, a logging tool may be lowered into the wellbore (104) to acquire measurements as the tool traverses a depth interval (130) (e.g., a targeted reservoir section) of the wellbore (104). The plot of the logging measurements versus depth may be referred to as a "log" or "well log". Well logs (104) may provide depth measurements of the well (102) that describe such reservoir characteristics as formation porosity, formation permeability, resistivity, and water saturation. The resulting logging measurements may be stored and/or processed, for example, by the control system (144), to generate corresponding well logs (140) for the well (102). A well log may include, for example, a plot of a logging response time versus true vertical depth (TVD) across the depth interval (130) of the wellbore (104).

Reservoir characteristics may be determined using a variety of different techniques. For example, certain reservoir characteristics can be determined via coring (e.g., physical extraction of rock samples) to produce core samples (150) and/or logging operations (e.g., wireline logging, logging-while-drilling (LWD) and measurement-while-drilling (MWD)). Coring operations may include physically extracting a rock sample from a region of interest within the wellbore (104) for detailed laboratory analysis. For example, when drilling an oil or gas well, a coring bit may cut plugs (or "cores") from the formation (106) and bring the plugs to the surface, and these core samples may be analyzed at the surface (e.g., in a lab) to determine various characteristics of the formation (106) at the location where the sample was obtained.

Multiple types of logging techniques are available for determining various reservoir characteristics, and a particular form of logging may be selected and used based on the logging conditions and the type of desired measurements. For example, NMR logging measures the induced magnetic moment of hydrogen nuclei (i.e., protons) contained within the fluid-filled pore space of porous media (e.g., reservoir rocks). Thus, NMR logs may measure the magnetic response of fluids present in the pore spaces of the reservoir rocks. In so doing, NMR logs may measure both porosity and permeability as well as the types of fluids present in the pore spaces. For determining permeability, another type of logging may be used that is called spontaneous potential (SP) logging. SP logging may determine the permeabilities of rocks in the formation (106) by measuring the amount of electrical current generated between drilling fluid produced by the drilling system (110) and formation water that is held in pore spaces of the reservoir rock. Porous sandstones with high permeabilities may generate more electricity than impermeable shales. Thus, SP logs may be used to identify sandstones from shales.

To determine porosity in the formation (106), various types of logging techniques may be used. For example, the logging system (112) may measure the speed that acoustic waves travel through rocks in the formation (106). This type of logging may generate borehole compensated (BHC) logs, which are also called sonic logs and acoustic logs. In general, sound waves may travel faster through high-density shales than through lower-density sandstones. Likewise, density logging may also determine porosity measurements by directly measuring the density of the rocks in the formation (106). Furthermore, neutron logging may determine porosity measurements by assuming that the reservoir pore spaces within the formation (106) are filled with either water or oil and then measuring the amount of hydrogen atoms (i.e., neutrons) in the pores.

Keeping with the various types of logging techniques, resistivity logging may measure the electrical resistivity of rock or sediment in and around the wellbore (104). In particular, resistivity measurements may determine what types of fluids are present in the formation (106) by measuring how effective these rocks are at conducting electricity. Because fresh water and oil are poor conductors of electricity, they have high resistivities. As such, resistivity measurements obtained via such logging can be used to determine corresponding reservoir water saturation ($S_w$).

Turning to simulator (160), a simulator (160) may include hardware and/or software with functionality for generating one or more trained models (170) regarding the formation (106). For example, the simulator (160) may store well logs (140) and data regarding core samples (150), and further analyze the well log data, the core sample data, seismic data, and/or other types of data to generate and/or update the one or more trained models (170). For example, different types of models may be trained, such as convolutional neural networks, deep neural networks, support vector machines, decision trees, inductive learning models, deductive learning models, supervised learning models, etc.

In some embodiments, the simulator (160) may include functionality for applying deep learning methodologies to precisely determine various subsurface layers. To do so, a large amount of interpreted data may be used to train a model. To obtain this amount of data, the simulator (160) may augment acquired data for various geological scenarios and drilling situations. For example, drilling logs may provide similar log signatures for a particular subsurface layer except where a well encounters abnormal cases. Such abnormal cases may include changes in subsurface geological compositions, well placement of artificial materials, or various subsurface mechanical factors that may affect logging tools. As such, the amount of well data with abnormal cases available to the simulator (160) may be insufficient for training a model. Therefore, in some embodiments, a simulator (160) may use data augmentation to generate a dataset that combines original acquired data with augmented data based on geological and drilling factors. This supplemented dataset may provide sufficient training data to train a model accordingly.

In some embodiments, the simulator (160) is implemented in a software platform for the control system (144). The software platform may obtain data acquired by the drilling system (110) and logging system (112) as inputs, which may include multiple data types from multiple sources. The software platform may aggregate the data from these systems (110, 112) in real time for rapid analysis. In some embodiments, the control system (144), the logging system (112), and/or the simulator (160) may include a computer system that is similar to the computer system (600) described below with regard to FIGS. 6A and 6B and the accompanying description.

Figure 2A:
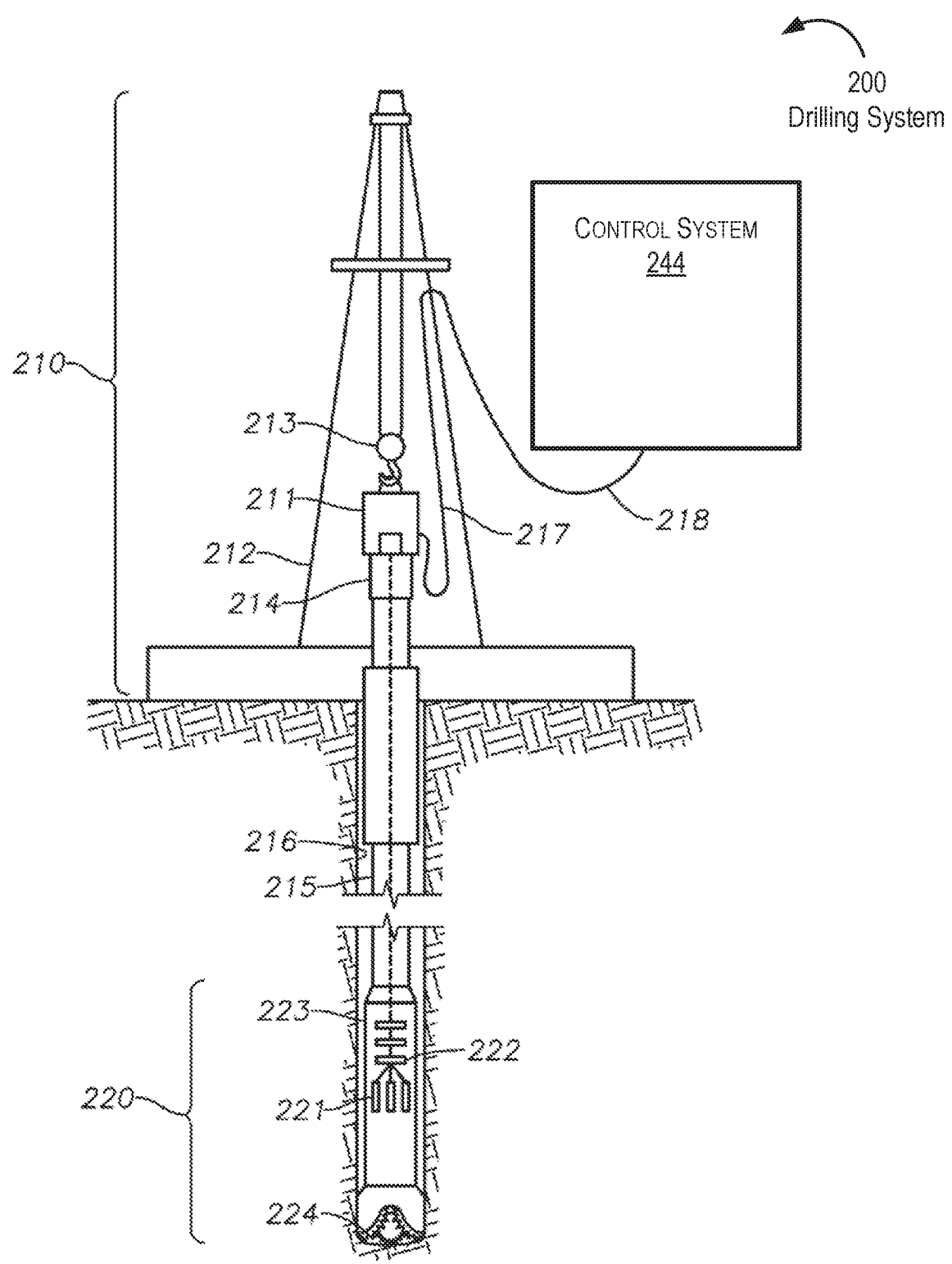
Figure 2B:
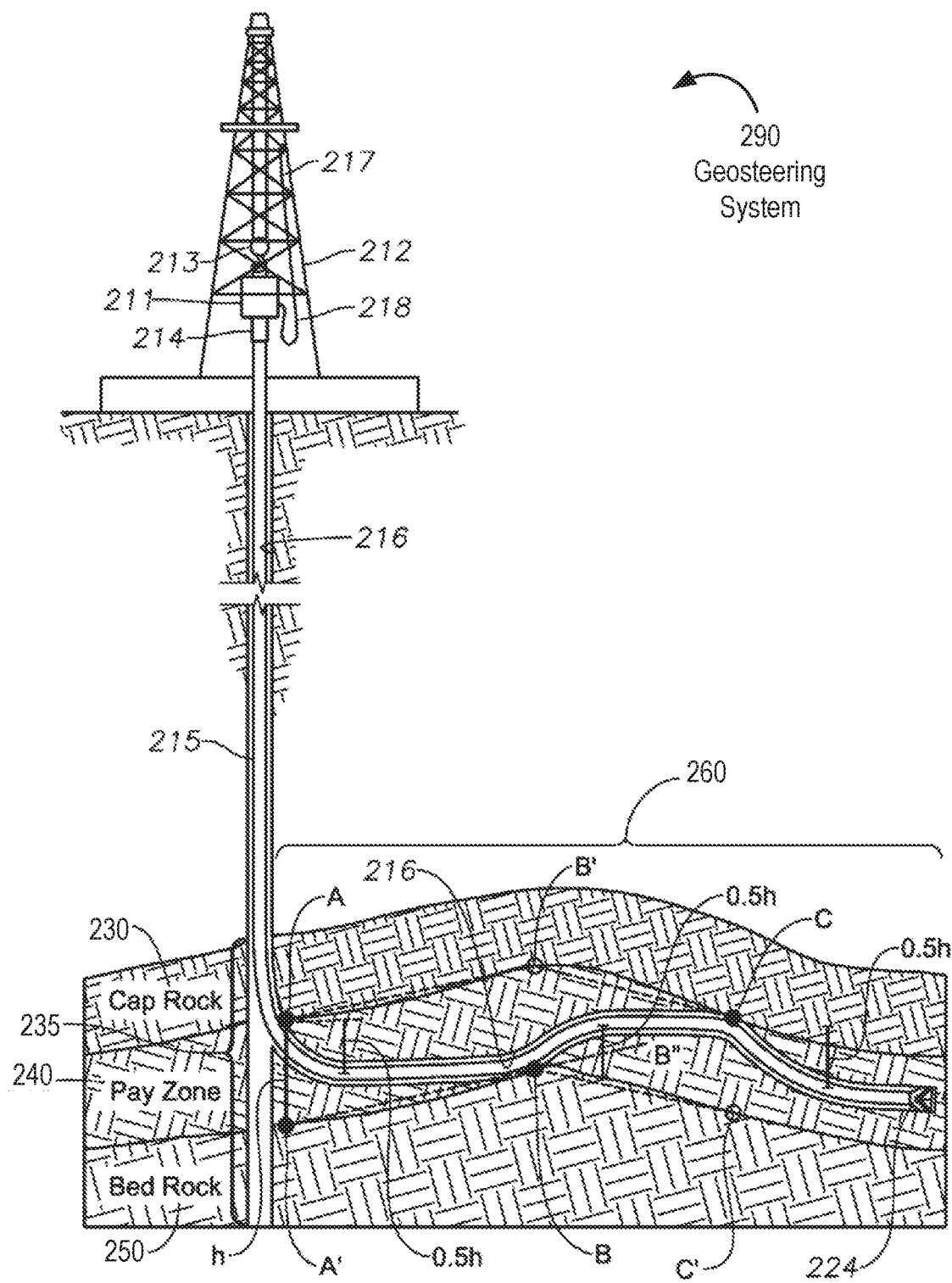

Turning to FIGS. 2A and 2B, FIGS. 2A and 2B illustrate systems in accordance with one or more embodiments. As shown in FIG. 2A, a drilling system (200) may include a top drive drill rig (210) arranged around the setup of a drill bit logging tool (220). A top drive drill rig (210) may include a top drive (211) that may be suspended in a derrick (212) by a travelling block (213). In the center of the top drive (211), a drive shaft (214) may be coupled to a top pipe of a drill string (215), for example, by threads. The top drive (211) may rotate the drive shaft (214), so that the drill string (215) and a drill bit logging tool (220) cut the rock at the bottom of a wellbore (216). A power cable (217) supplying electric power to the top drive (211) may be protected inside one or more service loops (218) coupled to a control system (244). As such, drilling mud may be pumped into the wellbore (216) through a mud line, the drive shaft (214), and/or the drill string (215). The control system (244) may be similar to control system (144) described above in FIG. 1 and the accompanying description.

Moreover, when completing a well, casing may be inserted into the wellbore (216). The sides of the wellbore (216) may require support, and thus the casing may be used for supporting the sides of the wellbore (216). As such, a space between the casing and the untreated sides of the wellbore (216) may be cemented to hold the casing in place. The cement may be forced through a lower end of the casing and into an annulus between the casing and a wall of the wellbore (216). More specifically, a cementing plug may be used for pushing the cement from the casing. For example, the cementing plug may be a rubber plug used to separate cement slurry from other fluids, reducing contamination and maintaining predictable slurry performance. A displacement fluid, such as water, or an appropriately weighted drilling mud, may be pumped into the casing above the cementing plug. This displacement fluid may be pressurized fluid that serves to urge the cementing plug downward through the casing to extrude the cement from the casing outlet and back up into the annulus.

As further shown in FIG. 2A, sensors (221) may be included in a sensor assembly (223), which is positioned adjacent to a drill bit (224) and coupled to the drill string (215). Sensors (221) may also be coupled to a processor assembly (223) that includes a processor, memory, and an analog-to-digital converter (222) for processing sensor measurements. For example, the sensors (221) may include acoustic sensors, such as accelerometers, measurement microphones, contact microphones, and hydrophones. Likewise, the sensors (221) may include other types of sensors, such as transmitters and receivers to measure resistivity, gamma ray detectors, etc. The sensors (221) may include hardware and/or software for generating different types of well logs (such as acoustic logs or sonic longs) that may provide well data about a wellbore, including porosity of wellbore sections, gas saturation, bed boundaries in a geologic formation, fractures in the wellbore or completion cement, and many other pieces of information about a formation. If such well data is acquired during drilling operations (i.e., logging-while-drilling), then the information may be used to make adjustments to drilling operations in real-time. Such adjustments may include rate of penetration (ROP), drilling direction, altering mud weight, and many others drilling parameters.

In some embodiments, acoustic sensors may be installed in a drilling fluid circulation system of a drilling system (200) to record acoustic drilling signals in real-time. Drilling acoustic signals may transmit through the drilling fluid to be recorded by the acoustic sensors located in the drilling fluid circulation system. The recorded drilling acoustic signals may be processed and analyzed to determine well data, such as lithological and petrophysical properties of the rock formation. This well data may be used in various applications, such as steering a drill bit using geosteering, casing shoe positioning, etc.

The control system (244) may be coupled to the sensor assembly (223) in order to perform various program functions for up-down steering and left-right steering of the drill bit (224) through the wellbore (216). More specifically, the control system (244) may include hardware and/or software with functionality for geosteering a drill bit through a formation in a lateral well using sensor signals, such as drilling acoustic signals or resistivity measurements. For example, the formation may be a reservoir region, such as a pay zone, bed rock, or cap rock.

Turning to geosteering, geosteering may be used to position the drill bit (224) or drill string (215) relative to a boundary between different subsurface layers (e.g., overlying, underlying, and lateral layers of a pay zone) during drilling operations. In particular, measuring rock properties during drilling may provide the drilling system (200) with the ability to steer the drill bit (224) in the direction of desired hydrocarbon concentrations. As such, a geosteering system may use various sensors located inside or adjacent to the drilling string (215) to determine different rock formations within a wellbore's path. In some geosteering systems, drilling tools may use resistivity or acoustic measurements to guide the drill bit (224) during horizontal or lateral drilling. When resistivity measurements are employed, the upper and lower boundaries of a subsurface layer are computed from geological models using inversion techniques. A geological model may include predefined resistivity levels for various layers, such as a predefined resistivity of a pay zone within the subsurface. When sonic measurements are employed, the upper and lower boundaries of a layer may be calculated based on the travelling time of reflected sonic waves and the corresponding sonic velocity of formation rocks.

Turning to FIG. 2B, FIG. 2B illustrates some embodiments for steering a drill bit through a lateral pay zone using a geosteering system (290). As shown in FIG. 2B, the geosteering system (290) may include the drilling system (200) from FIG. 2A. In particular, the geosteering system (290) may include functionality for monitoring various sensor signatures (e.g., an acoustic signature from acoustic sensors) that gradually or suddenly change as a wellbore path traverses a cap rock (230), a pay zone (240), and a bed rock (250). Because of the sudden change in lithology between the cap rock (230) and the pay zone (240), for example, a sensor signature of the pay zone (240) may be different from the sensor signature of the cap rock (230). When the drill bit (224) drills out of the pay zone (240) into the cap rock (230), a detected amplitude spectrum of a particular sensor type may change suddenly between the two distinct sensor signatures. In contrast, when drilling from the pay zone (240) downward into the bed rock (250), the detected amplitude spectrum may gradually change.

During the lateral drilling of the wellbore (216), preliminary upper and lower boundaries of a formation layer's thickness may be derived from a geophysical survey and/or an offset well obtained before drilling the wellbore (216). If a vertical section (235) of the well is drilled, the actual upper and lower boundaries of a formation layer (i.e., actual pay zone boundaries (A, A')) and the pay zone thickness (i.e., A to A') at the vertical section (235) may be determined. Based on this well data, an operator may steer the drill bit (224) through a lateral section (260) of the wellbore (216) in real time. In particular, a logging tool may monitor a detected sensor signature proximate the drill bit (224), where the detected sensor signature may continuously be compared against prior sensor signatures, e.g., of the cap rock (230), pay zone (240), and bed rock (250), respectively. As such, if the detected sensor signature of drilled rock is the same or similar to the sensor signature of the pay zone (240), the drill bit (224) may still be drilling in the pay zone (240). In this scenario, the drill bit (224) may be operated to continue drilling along its current path and at a predetermined distance (0.5 h) from a boundary of a formation layer. If the detected sensor signature is same as or similar to the prior sensor signatures of the cap rock (230) or the bed rock (250), respectively, then the control system (244) may determine that the drill bit (224) is drilling out of the pay zone (240) and into the upper or lower boundary of the pay zone (240). At this point, the vertical position of the drill bit (224) at this lateral position within the wellbore (216) may be determined and the upper and lower boundaries of the pay zone (240) may be updated, (for example, positions B and C in FIG. 2B). In some embodiments, the vertical position at the opposite boundary may be estimated based on the predetermined thickness of the pay zone (240), such as positions B' and C'.

Returning to FIG. 1, in some embodiments, a well path of a wellbore (104) is updated using a trained model (e.g., one of the trained models (170)) by the control system (144). For example, a control system (144) may communicate geosteering commands to the drilling system (110) based on well data updates that are further adjusted by the simulator (160) using a trained model. As such, the control system (144) may generate one or more control signals for drilling equipment based on an updated well path design and/or reservoir model.

While FIGS. 1, 2A, and 2B shows various configurations of components, other configurations may be used without departing from the scope of the disclosure. For example, various components in FIGS. 1, 2A, and 2B may be combined to create a single component. As another example, the functionality performed by a single component may be performed by two or more components.

Figure 3:
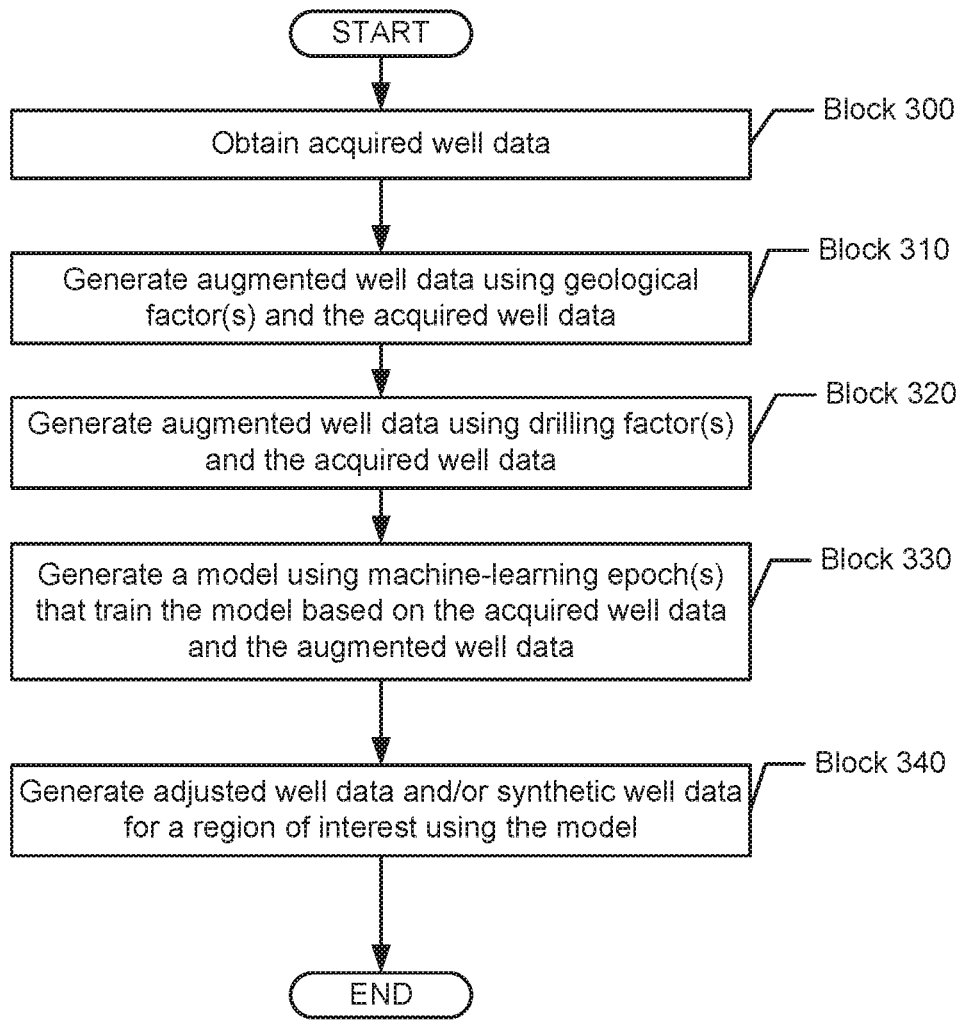
FIG. 3 shows a flowchart in accordance with one or more embodiments.

Turning to FIG. 3, FIG. 3 shows a flowchart in accordance with one or more embodiments. Specifically, FIG. 3 describes a general method for generating and/or using a trained model based on augmented well data. One or more blocks in FIG. 3 may be performed by one or more components (e.g., simulator (144)) as described in FIGS. 1, 2A, and 2B. While the various blocks in FIG. 3 are presented and described sequentially, one of ordinary skill in the art will appreciate that some or all of the blocks may be executed in different orders, may be combined or omitted, and some or all of the blocks may be executed in parallel. Furthermore, the blocks may be performed actively or passively.

In Block 300, acquired well data are obtained in accordance with one or more embodiments. For example, the acquired well data may correspond to well logs obtained for an interval of interest using a logging system (112) and/or logging tools (113) described above in FIG. 1 and the accompanying description. The interval of interest may be a particular depth interval within a formation, for example.

In Block 310, augmented well data is generated using one or more geological factors and acquired well data in accordance with one or more embodiments. For example, data augmentation may include performing various processes on acquired data, such as log cropping or adding noise, in order to generate augmented data. In particular, data augmentation for well data may introduce various machine-learning algorithms to uncommon problems, such as problems specific to random geological and mechanical processes. For example, a data augmentation process may alter a normal well log to produce an extremely complex log that mimics circumstances faced by real-time drilling operations. Through such augmented well data, an artificial intelligence model may be made immune to various abnormalities that might occur while drilling through an unknown formation.

Furthermore, different wells may include differences in rock compositions in terms of minerals, textures, cementation, dissolutions, and/or radioactive material levels. For example, gamma ray (GR) logs may typically provide low amplitudes in a uniform sandstone formation, while amplitudes in a GR log may relatively increase based on increasing quantities of feldspars, micas, glauconite, and/or heavy minerals increase. Likewise, spatial and lateral changes in rock facies and depositional environments may introduce their own anomalies in well data. For example, spatial and lateral changes may result in different shapes within well logs that may range from a smooth shape to a serrated shape, e.g., indicating a depositional environment within the formation.

Other geological factors causing non-typical well data may include differences in thicknesses of a subsurface layer due to compaction, expansion, subsidence, and/or pinch out. Faults and nonconformities within a formation may also induce changes within well data, e.g., because of unusual cementation or paleosol. Moreover, localized washouts within a formation, e.g., due to erosion, may adjust a well log locally, such reducing amplitude in a gamma ray log in a low radioactivity formation. Another geological factor that may affect well data measurements is borehole quality. For example, well caving may affect the borehole by increasing drilling fluid between the formation wall and a logging tool, such as a gamma ray detector. Also the loss of circulation in a drilling fluid circulation system may disrupt measured sensor values because of the resulting mixed mud matrix.

In Block 320, augmented well data is generated using one or more drilling factors and acquired well data in accordance with one or more embodiments. Similar to data augmentation for geological factors, well data may be augmented to account for drilling factors. In particular, a data augmentation process may address borehole quality as a result of a particular drilling operation. For example, various drilling fluid additives such as potassium chloride (KCL), may have a level of radioactivity, which can intensely increase the measured values of GR logs. On the other hand, where drilling mud includes barite, barite may absorb gamma rays that result in anomalously low gamma ray measurements. In some embodiments, well data is affected by attenuating sensing signals through artificial materials, such as cemented sections or casing within a wellbore. For example, cemented sections and casing may reduce the amplitude of gamma rays received by a logging tool.

Furthermore, while recording logging measurements within a wellbore, a stick-and-slip operation may occur. For example, a stick-and-slip operation may correspond to an irregular movement of a logging tool within a wellbore resulting from the logging tool becoming stuck at some point in the wellbore. After being stuck, the logging tool may become suddenly released resulting in inaccurate depth measurements of the well log data. As such, well logs may be compressed and/or stretched depending on the specifics of the stick-and-slip operation. Stick-and-slip operations may occur due to differential pressure or an irregular-shaped wellbore. Accordingly, in some embodiments, well data may be augmented to emulate a stick-and-slip operation within a well log.

In some embodiments, well data is augmented to account for the lifetime and calibration of a logging tool being used to acquire well data measurements. For example, depending on the length of time and/or physical conditions of a logging tool in a well, the logging tool may need to be recalibrated in order to provide accurate sensor measurements. Without calibration, the well data may be offset from the actual well properties. Thus, data augmentation may generate augmented well data similar to well data produced by a logging tool in need of calibration.

Well data may also be augmented to account for various drilling parameters associated with a wellbore. For example, different mud weights may result in different received signals by a logging tool, because a higher density of mud may attenuate measured sensor values. In another example, different borehole diameters may also result in variations of the amounts of drilling fluid between the formation wall and a logging tool depending on the depth within the wellbore.

In Block 330, a model is generated using one or more machine-learning epochs that train the model based on acquired well data and augmented well data in accordance with one or more embodiments. In some embodiments, a model is generated in three parts: (1) generating training data; (2) training of the model using the generated training data; and (3) updating the model based on prediction results where the model attempts to replicate well data. Generating training data may include sampling well data from a larger acquired well database in addition to using an augmented dataset. For example, the augmented dataset may be similar to the augmented well data generated above in Blocks 310 and 320. Likewise, the acquired dataset may correspond to the original measured values acquired during a well logging operation. In contrast, the augmented well data may represent measured sensor values after being processed by one or more data augmentation perturbations for simulating scenarios based on different geological factors and/or drilling factors.

In some embodiments, a model is trained using multiple machine-learning epochs. For example, a machine-learning epoch may be an iteration of a model through a portion or all of the training data. For example, a single machine-learning epoch may correspond to a specific batch of well data, where the training data is divided into multiple batches for multiple epochs. Thus, a model may be trained iteratively using epochs until the model achieves a predetermined level of accuracy in predicting well data. In some embodiments, a certain percentage of acquired well data and augmented well data may be imported into a particular epoch to strengthen the training part of the machine-learning algorithm. Better training of the model which in turn may lead to better predictions for updating the model. Once the training data is passed through all of the epochs and the model is further updated based on the model's predictions in each epoch, a trained model may be the final result of the machine-learning algorithm. In some embodiments, multiple trained models are compared and the best trained model is selected accordingly.

Figure 4A:
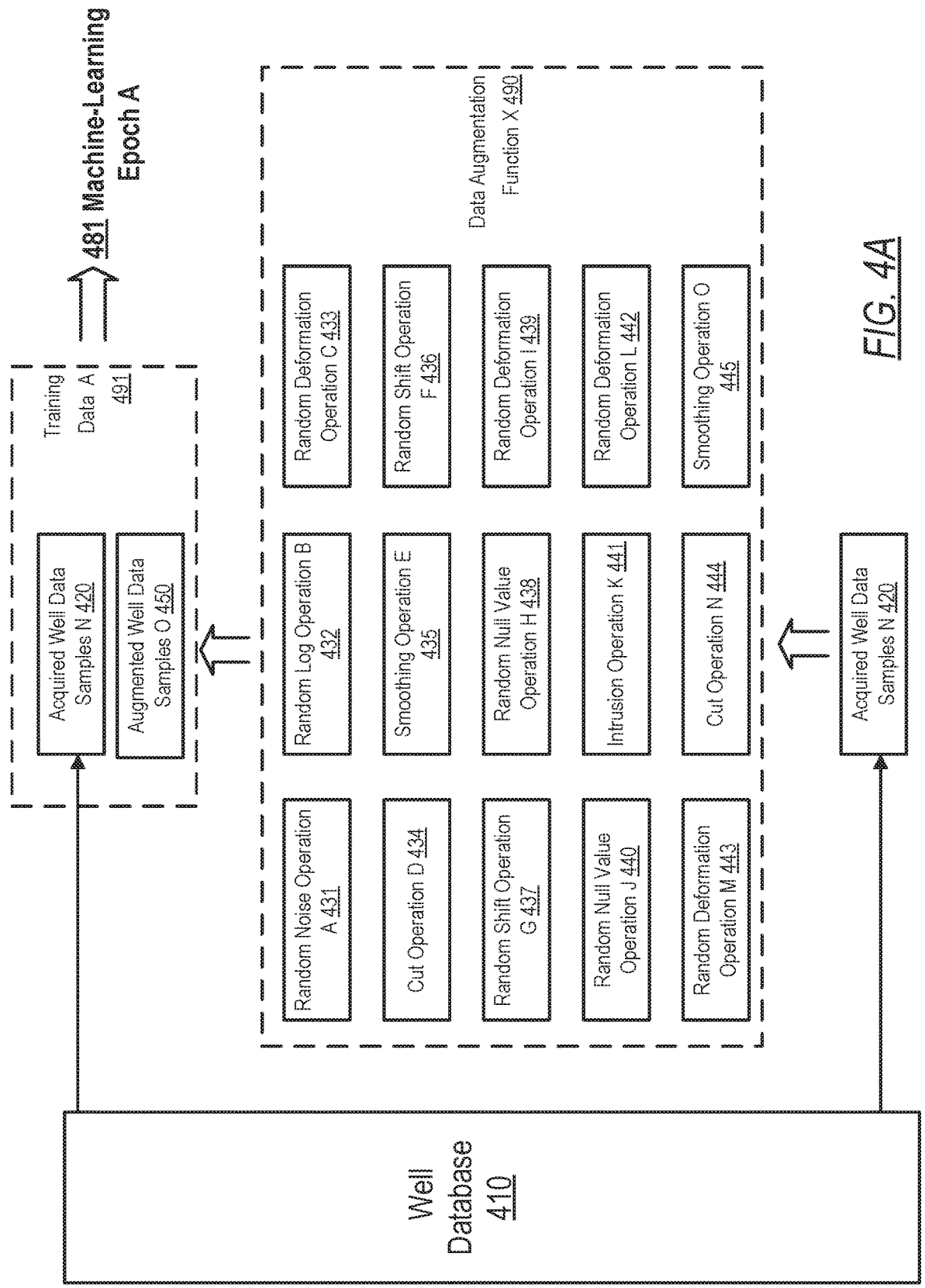
FIGS. 4A and 4B show an example in accordance with one or more embodiments.
Figure 4B:
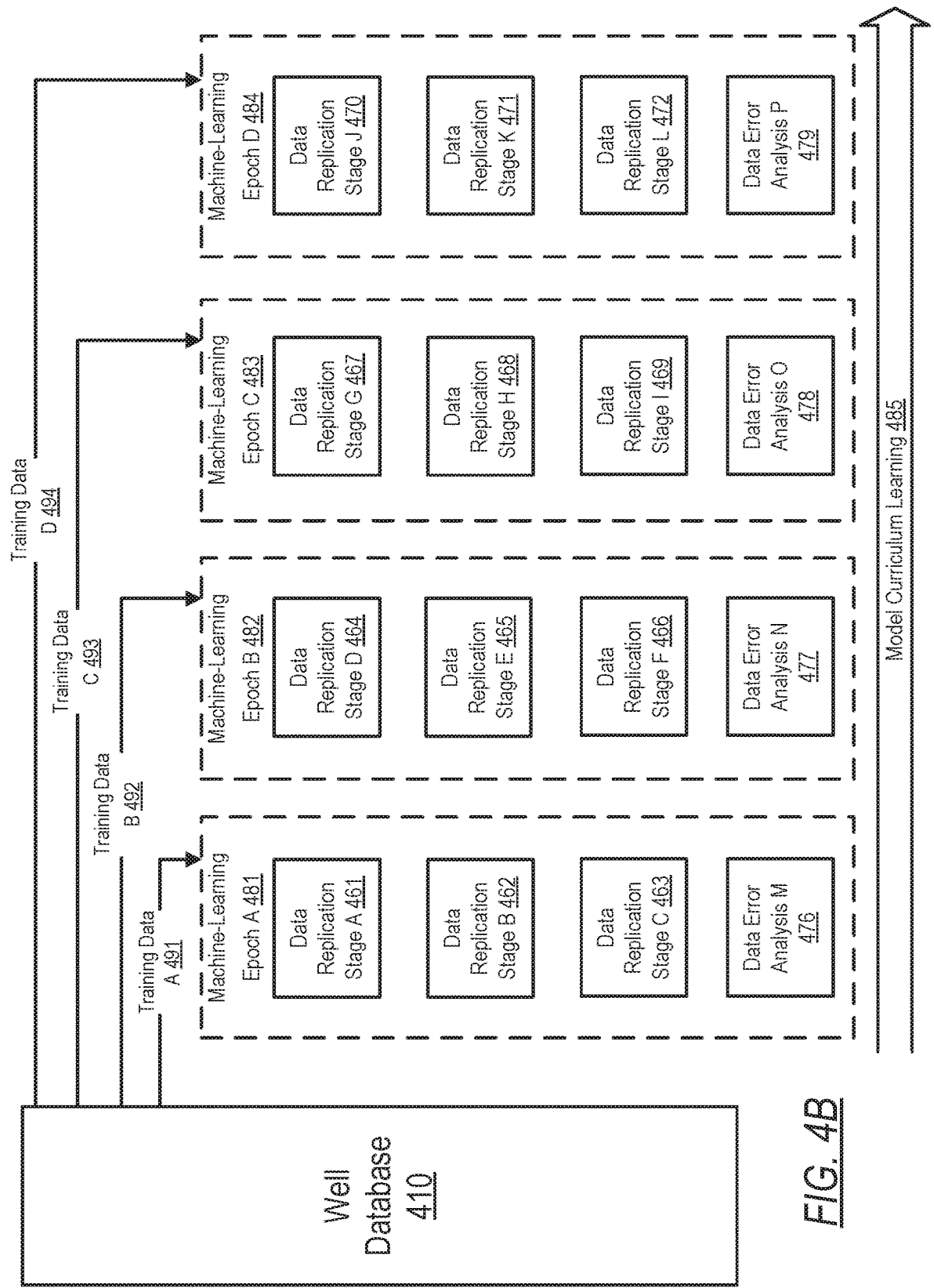

Turning to FIGS. 4A and 4B, FIGS. 4A and 4B provide an example of training a model using augmented well data and machine-learning epochs. The following example is for explanatory purposes only and not intended to limit the scope of the disclosed technology.

In FIG. 4A, a well database (410) includes different types of acquired well data from multiple well sites. For example, the well database (410) may include data for different types of reservoirs and different types of wells. Initially, a data augmentation function X (490) operated by a simulator obtains an initial batch of data (i.e., acquired well data samples N (420)) for a machine-learning epoch A (481). Here, the well data samples N (420) are used as both an input to the data augmentation function X (490) as well as for being directly included in the training data for processing by the machine-learning epoch A (481).

Keeping with FIG. 4A, the data augmentation function X (490) may perform multiple data augmenting operations on the acquired well data samples N (420). For example, the data augmentation function X (490) performs a random deformation operation C (433), a random deformation operation I (439), and a random deformation operation L (442). In particular, a random deformation may include deforming data from an original state to a deformed one, e.g., converting well data to different thicknesses and different intensities by stretching and squeezing the data. The random deformation operations (433, 439, 442) may be based on geological and drilling factors, such as formation layers of different compositions, spatial and lateral changes, faults and unconformities in the formation, borehole quality, a stick-and-slip operation, and/or logging tool lifetime and calibration settings, etc.

Furthermore, the data augmentation function X (490) also performs a smoothing operation E (435) and a smoothing operation O (445). For example, a smoothing operation may remove data spikes within well data, such as through resampling data to smooth out the well data. For example, training data may be subjected to a smoothing operation for multiple purposes to provide reliable data that may improve machine learning.

The data augmentation function X (490) also performs an intrusion operation K (441). An intrusion operation may augment data by adding random values to data in specific areas depending on the type of augmenting factor. For example, an intrusion operation may be performed where a gamma ray log experiences a localized washout, spatial and lateral changes occur in a rock facies, and/or differences in layer thicknesses occur within a formation.

The data augmentation function X (490) also performs a random noise operation A (431). For example, a random noise operation may add noise in different amounts to different depths of well data. A random noise operation may correspond to data augmentation based on geological factors and/or drilling factors, such as differences in rock composition, borehole quality, attenuation of received signals due to artificial materials, a stick-and-slip operation, a lifetime and calibration of a logging tool, mud weight properties, and/or borehole diameter.

The data augmentation function X (490) also performs a cut operation D (434) and a cut operation N (444). For example, a cut operation may remove data within a well log randomly. Examples of geological factors that correspond to this type of data augmentation may include spatial and lateral changes occurring in a rock facies, and/or differences in layer thicknesses occur within a formation.

The data augmentation function X (490) also performs a random log operation B (432). In particular, a new log may be generated by smoothing an acquired log and adding it to the original log to increase complexity of the original log. For example, random log generation may be based on a realistic data augmentation to enable machine learning and thus produce reliable training data. The training data may be used in a practical and/or industrial setting.

The data augmentation function X (490) also performs a random null value operation H (438) and a random null operation J (440). A random null operation may assign a zero value to well data at different thicknesses. For example, where a logging tool is approaching the end of its lifetime or due to calibration errors, sensors in the logging tool may improperly generate a null value when measuring a formation. Thus, the random null operation may emulate this phenomenon.

The data augmentation function X (490) also performs a random shift operation F (436) and a random shift operation G (437). A random shifting operation may shift a range of data values within well data within the same depth, such as through shortening the range or lengthening the range. Thus, random shifting may emulate differences in rock composition, stick-and-slip operations, drilling factors, and attenuation of received signals at a logging tool.

While some of the operations for the data augmentation function X (490) are described as being random, the augmenting processes may include pseudorandom process and processes tailored to specific criteria. In some embodiments, for example, the data augmentation operations may be a function of geologist requirements. In particular, there may be areas of a formation where deformations and intrusions are expected, and the well data may be augmented accordingly.

Turning to FIG. 4B, FIG. 4B shows various machine-learning epochs (i.e., machine-learning epoch A (481), machine-learning epoch B (482), machine-learning epoch C (483), machine-learning epoch D (484)) to train a model. In particular, the data augmentation processes shown in FIG. 4A correspond to training data A (491) that is input into the machine-learning epoch A (481). Within machine-learning epoch A (481), a machine-learning algorithm undergoes multiple attempts at replicating a batch of data that includes a portion of the acquired well data samples N (420) and the augmented well data samples O (450). As shown in FIG. 4B, the model performs a data replication stage A (461), a data replication stage B (462), and a data replication stage C (463) in a training phase. After the training phase, the model then attempts to predict a different portion of the training data. Specifically, the machine-learning algorithm analyzes predicted data from the model in the data error analysis M (476) in related to a different portion of the data from the training data A (491) that was not used for training. Depending on the difference between the predicted data and corresponding portion of the training data, parameters within the model may be updated accordingly.

After traversing the machine-learning epoch A (481), the model is further trained in machine-learning epoch B (482) using training data B (492), where the machine-learning epoch B (482) includes a data replication stage D (464), a data replication stage E (465), a data replication stage F (466), and a data error analysis N (477). Thus, with each subsequent machine-learning epoch, the model is undergoing a model curriculum learning (485) where the model's error rate at predicting well data decreases. Likewise, the model is trained again in machine-learning epoch C (483) using training data C (493), where the machine-learning epoch C (483) includes a data replication stage G (467), a data replication stage H (468), a data replication stage I (469), and a data error analysis O (478). Finally, the model undergoes the final machine-learning epoch D (484) that includes a data replication stage J (470), a data replication stage K (471), a data replication stage L (472), and a data error analysis P (479). Accordingly, the model described in FIGS. 4A and 4B is fully trained after the machine-learning epoch D (484). However, many models are trained using far more than four machine-learning epochs.

Returning to FIG. 3, in Block 340, adjusted well data and/or synthetic well data is generated for a region of interest using a model in accordance with one or more embodiments. In particular, a trained model may be used to adjust well data to account for various factors that affect actual rock properties. Likewise, a trained model may also be used to generate synthetic, e.g., at areas in a formation outside the sensing capacity of a logging tool. Likewise, synthetic data may be generated for modeling larger regions of interest within a formation.

In some embodiments, the trained model may address overfitting issues with respect to acquired well data. Likewise, the trained model may be used for data labelling within a well dataset or identifying discrepancies with the acquired well data. In one or more embodiments, the trained model may be used for determining the top of one or more formations within a subsurface, e.g., for formation top picking.

In some embodiments, the process described in FIG. 3 may be used to adjust other types of data, such as time-series data used in facies predictions, velocity modeling, and/or seismic interpretations. For example, seismic data may be augmented for training a model used in performing seismic inversion or a migration algorithm.

Figure 5:
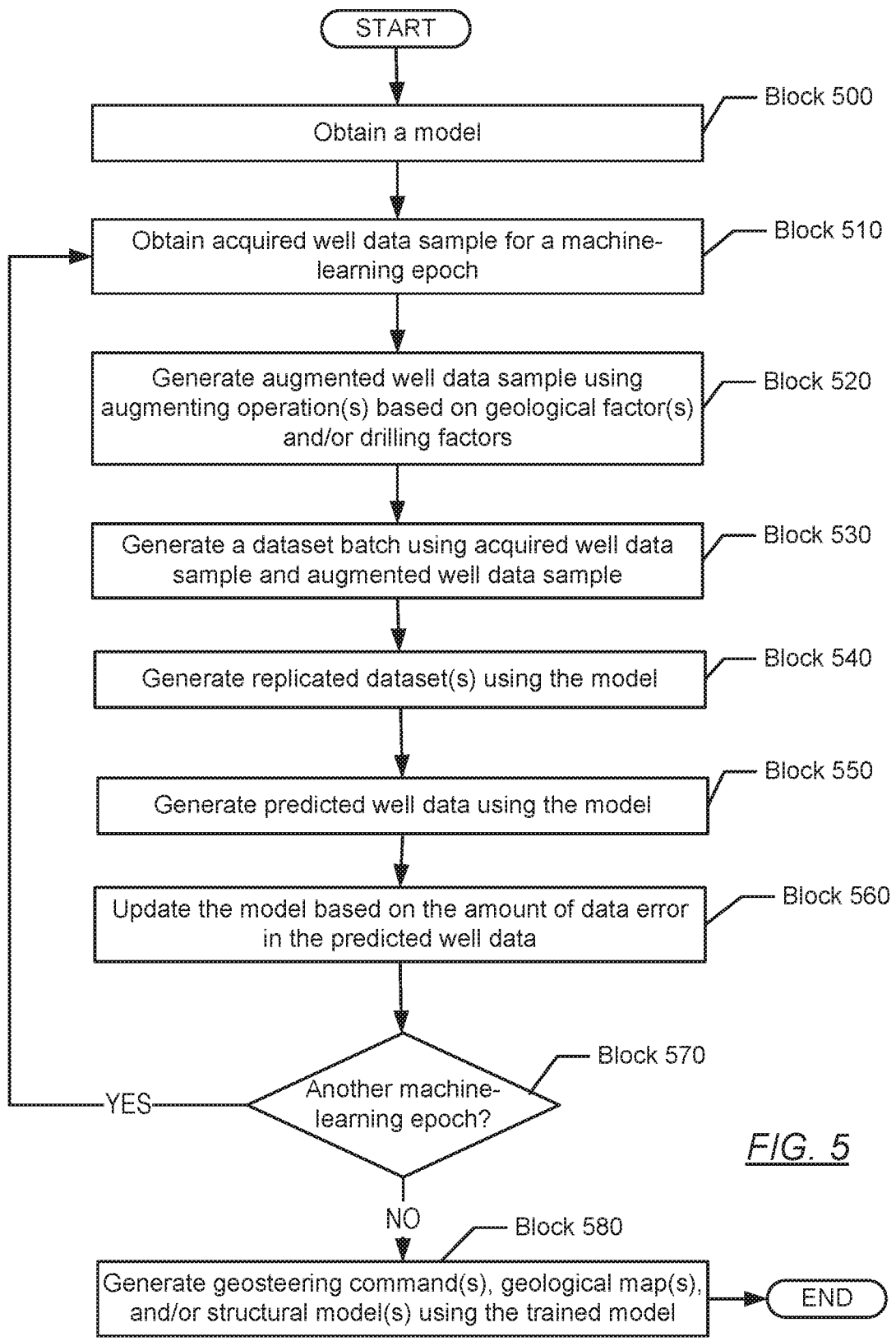
FIG. 5 shows a flowchart in accordance with one or more embodiments.

Turning to FIG. 5, FIG. 5 shows a flowchart in accordance with one or more embodiments. Specifically, FIG. 5 describes a specific method for generating and/or using a trained model based on augmented well data. One or more blocks in FIG. 5 may be performed by one or more components (e.g., simulator (144)) as described in FIGS. 1, 2A, and 2B. While the various blocks in FIG. 5 are presented and described sequentially, one of ordinary skill in the art will appreciate that some or all of the blocks may be executed in different orders, may be combined or omitted, and some or all of the blocks may be executed in parallel. Furthermore, the blocks may be performed actively or passively.

In Block 500, a model is obtained in accordance with one or more embodiments. For example, multiple types of models may be trained using one or more machine-learning algorithms in the process described in FIG. 5. Based on the prediction accuracy of the final trained models, one or more of the trained models may be selected for various applications using well data.

In Block 510, an acquired well data sample is obtained for a machine-learning epoch in accordance with one or more embodiments. The acquired well data sample may be obtained in a similar manner as the acquired well data in Block 300 above. The acquired well data sample may form a portion of a batch of data for a corresponding machine-learning epoch. Accordingly, after a particular machine-learning epoch is complete in updating a model, another well data may be obtained, e.g., from a well database.

In Block 520, augmented well data sample is generated using one or more augmenting operations based on one or more geological factors and/or one or more drilling factors in accordance with one or more embodiments. For example, an acquired well data sample may be augmented in a similar manner as described above in Blocks 310 and/or 320. Furthermore, without data augmentation, many geological and/or drilling situations may not be captured in a model's training. In order to train a model on all possible cases experienced by logging tools during well data acquisition, data augmentation provides the missing gaps of the training data.

In Block 530, a dataset batch is generated using an acquired well data sample and an augmented well data sample in accordance with one or more embodiments. For example, acquired well data and augmented well data may be combined in equal portions. However, in some embodiments, different percentages may be used, e.g., 70% augmented well data and 30% acquired well data. Likewise, the data set batch may also include synthetic data, such as in situations where there is insufficient well data to train a model.

In Block 540, one or more replicated datasets are generated using a model in accordance with one or more embodiments. In particular, a model may generate sampled well data multiple times in order to train during a training phase of a machine-learning algorithm. The training phase may include updating weights and/or biases within the model based on the replication stages. In particular, the weights and/or biases may be implemented using a matrix of values updated throughout performance of a machine-learning algorithm. For an example of data replication, see FIGS. 4A and 4B and the accompanying description above.

In Block 550, predicted well data is generated using a model in accordance with one or more embodiments. In particular, several input may be obtained by the model for generating the predicted well data, such as types of logging tools, parameters describing the rock formation, location in a wellbore, etc.

In Block 560, a model is updated based on an amount of data error in the predicted well data in accordance with one or more embodiments. For example, the prediction part of a machine-learning algorithm may be used to test the accuracy of a trained model. A portion of a machine-learning epoch's batch from Block 510 may then be used at this point for verifying the validity of the trained model. This non-predicted data is then compared with the predicted well data to determine the difference or amount of data error. Depending on the amount of data error, a learning rate of the model may be adjusted for the next epoch.

In Block 570, a determination is made whether a model is trained with another machine-learning epoch in accordance with one or more embodiments. For example, a machine-learning algorithm may obtain a user input regarding the total number of machine-learning epochs for use in the model training. Likewise, depending on the amount of data error determined in Block 560, the machine-learning algorithm may automatically determine that the model is done training. When a determination is made that another machine-learning epoch is to be performed on the model, the process may proceed to Block 510. When a determination is made that the model is done training, the process may return to Block 580.

In Block 580, one or more geosteering commands, one or more geological maps, and/or one or more structural models are generated using a trained model in accordance with one or more embodiments. For example, a trained model may be used for multiple different applications. In some embodiments, a trained model is used in handling a large number of geosteering operations. For example, a well path may be adjusted using a trained model, and corresponding geosteering commands may be transmitted by a control system accordingly.

In another embodiment, formation top picking may be performed using the trained model where there is an insufficient amount of well data. Likewise, real-time 2-D geological maps of a formation or reservoir may be generated using a trained model. In another embodiment, 3-D structural models may be updated using a trained model instantaneously during drilling operations. Likewise, the trained model may be used to automatically identify interpretation discrepancies in a well database.

Figure 6A:
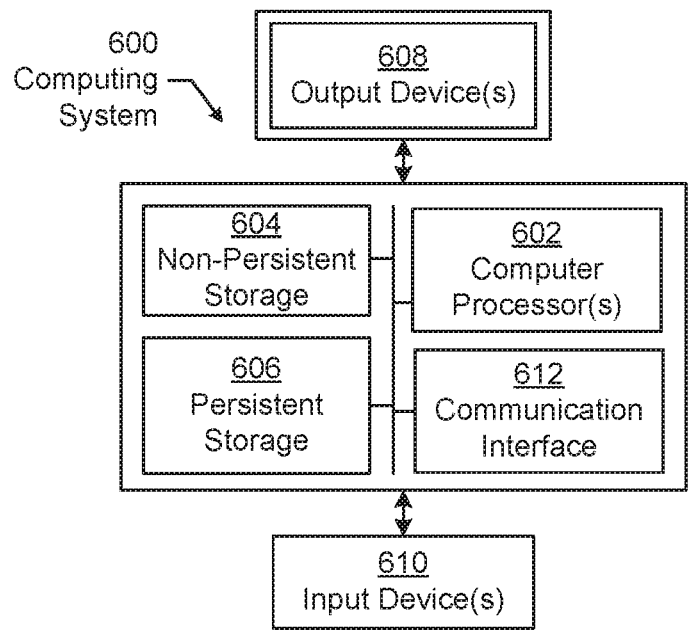
FIGS. 6A and 6B show a computing system in accordance with one or more embodiments.

Embodiments may be implemented on a computing system. Any combination of mobile, desktop, server, router, switch, embedded device, or other types of hardware may be used. For example, as shown in FIG. 6A, the computing system (600) may include one or more computer processors (602), non-persistent storage (604) (e.g., volatile memory, such as random access memory (RAM), cache memory), persistent storage (606) (e.g., a hard disk, an optical drive such as a compact disk (CD) drive or digital versatile disk (DVD) drive, a flash memory, etc.), a communication interface (612) (e.g., Bluetooth interface, infrared interface, network interface, optical interface, etc.), and numerous other elements and functionalities.

The computer processor(s) (602) may be an integrated circuit for processing instructions. For example, the computer processor(s) may be one or more cores or micro-cores of a processor. The computing system (600) may also include one or more input devices (610), such as a touchscreen, keyboard, mouse, microphone, touchpad, electronic pen, or any other type of input device.

The communication interface (612) may include an integrated circuit for connecting the computing system (600) to a network (not shown) (e.g., a local area network (LAN), a wide area network (WAN) such as the Internet, mobile network, or any other type of network) and/or to another device, such as another computing device.

Further, the computing system (600) may include one or more output devices (608), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (602), non-persistent storage (604), and persistent storage (606). Many different types of computing systems exist, and the aforementioned input and output device(s) may take other forms.

Software instructions in the form of computer readable program code to perform embodiments of the disclosure may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments of the disclosure.

Figure 6B:
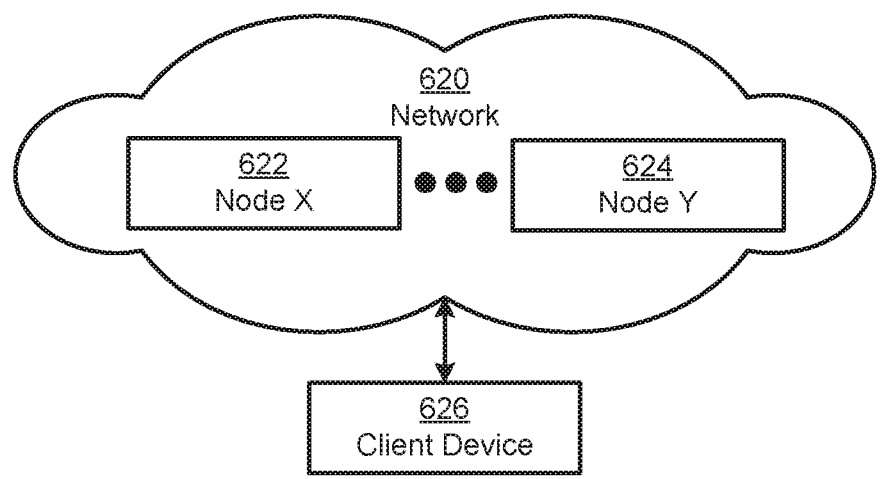

The computing system (600) in FIG. 6A may be connected to or be a part of a network. For example, as shown in FIG. 6B, the network (620) may include multiple nodes (e.g., node X (622), node Y (624)). Each node may correspond to a computing system, such as the computing system shown in FIG. 6A, or a group of nodes combined may correspond to the computing system shown in FIG. 6A. By way of an example, embodiments of the disclosure may be implemented on a node of a distributed system that is connected to other nodes. By way of another example, embodiments of the disclosure may be implemented on a distributed computing system having multiple nodes, where each portion of the disclosure may be located on a different node within the distributed computing system. Further, one or more elements of the aforementioned computing system (600) may be located at a remote location and connected to the other elements over a network.

Although not shown in FIG. 6B, the node may correspond to a blade in a server chassis that is connected to other nodes via a backplane. By way of another example, the node may correspond to a server in a data center. By way of another example, the node may correspond to a computer processor or micro-core of a computer processor with shared memory and/or resources.

The nodes (e.g., node X (622), node Y (624)) in the network (620) may be configured to provide services for a client device (626). For example, the nodes may be part of a cloud computing system. The nodes may include functionality to receive requests from the client device (626) and transmit responses to the client device (626). The client device (626) may be a computing system, such as the computing system shown in FIG. 6A. Further, the client device (626) may include and/or perform all or a portion of one or more embodiments of the disclosure.

The computing system or group of computing systems described in FIGS. 6A and 6B may include functionality to perform a variety of operations disclosed herein. For example, the computing system(s) may perform communication between processes on the same or different systems. A variety of mechanisms, employing some form of active or passive communication, may facilitate the exchange of data between processes on the same device. Examples representative of these inter-process communications include, but are not limited to, the implementation of a file, a signal, a socket, a message queue, a pipeline, a semaphore, shared memory, message passing, and a memory-mapped file. Further details pertaining to a couple of these non-limiting examples are provided below.

Based on the client-server networking model, sockets may serve as interfaces or communication channel endpoints enabling bidirectional data transfer between processes on the same device. Foremost, following the client-server networking model, a server process (e.g., a process that provides data) may create a first socket object. Next, the server process binds the first socket object, thereby associating the first socket object with a unique name and/or address. After creating and binding the first socket object, the server process then waits and listens for incoming connection requests from one or more client processes (e.g., processes that seek data). At this point, when a client process wishes to obtain data from a server process, the client process starts by creating a second socket object. The client process then proceeds to generate a connection request that includes at least the second socket object and the unique name and/or address associated with the first socket object. The client process then transmits the connection request to the server process. Depending on availability, the server process may accept the connection request, establishing a communication channel with the client process, or the server process, busy in handling other operations, may queue the connection request in a buffer until the server process is ready. An established connection informs the client process that communications may commence. In response, the client process may generate a data request specifying the data that the client process wishes to obtain. The data request is subsequently transmitted to the server process. Upon receiving the data request, the server process analyzes the request and gathers the requested data. Finally, the server process then generates a reply including at least the requested data and transmits the reply to the client process. The data may be transferred, more commonly, as datagrams or a stream of characters (e.g., bytes).

Shared memory refers to the allocation of virtual memory space in order to substantiate a mechanism for which data may be communicated and/or accessed by multiple processes. In implementing shared memory, an initializing process first creates a shareable segment in persistent or non-persistent storage. Post creation, the initializing process then mounts the shareable segment, subsequently mapping the shareable segment into the address space associated with the initializing process. Following the mounting, the initializing process proceeds to identify and grant access permission to one or more authorized processes that may also write and read data to and from the shareable segment. Changes made to the data in the shareable segment by one process may immediately affect other processes, which are also linked to the shareable segment. Further, when one of the authorized processes accesses the shareable segment, the shareable segment maps to the address space of that authorized process. Often, one authorized process may mount the shareable segment, other than the initializing process, at any given time.

Other techniques may be used to share data, such as the various data described in the present application, between processes without departing from the scope of the disclosure. The processes may be part of the same or different application and may execute on the same or different computing system.

Rather than or in addition to sharing data between processes, the computing system performing one or more embodiments of the disclosure may include functionality to receive data from a user. For example, in one or more embodiments, a user may submit data via a graphical user interface (GUI) on the user device. Data may be submitted via the graphical user interface by a user selecting one or more graphical user interface widgets or inserting text and other data into graphical user interface widgets using a touchpad, a keyboard, a mouse, or any other input device. In response to selecting a particular item, information regarding the particular item may be obtained from persistent or non-persistent storage by the computer processor. Upon selection of the item by the user, the contents of the obtained data regarding the particular item may be displayed on the user device in response to the user's selection.

By way of another example, a request to obtain data regarding the particular item may be sent to a server operatively connected to the user device through a network. For example, the user may select a uniform resource locator (URL) link within a web client of the user device, thereby initiating a Hypertext Transfer Protocol (HTTP) or other protocol request being sent to the network host associated with the URL. In response to the request, the server may extract the data regarding the particular selected item and send the data to the device that initiated the request. Once the user device has received the data regarding the particular item, the contents of the received data regarding the particular item may be displayed on the user device in response to the user's selection. Further to the above example, the data received from the server after selecting the URL link may provide a web page in Hyper Text Markup Language (HTML) that may be rendered by the web client and displayed on the user device.

Once data is obtained, such as by using techniques described above or from storage, the computing system, in performing one or more embodiments of the disclosure, may extract one or more data items from the obtained data. For example, the extraction may be performed as follows by the computing system (600) in FIG. 6A. First, the organizing pattern (e.g., grammar, schema, layout) of the data is determined, which may be based on one or more of the following: position (e.g., bit or column position, Nth token in a data stream, etc.), attribute (where the attribute is associated with one or more values), or a hierarchical/tree structure (consisting of layers of nodes at different levels of detail—such as in nested packet headers or nested document sections). Then, the raw, unprocessed stream of data symbols is parsed, in the context of the organizing pattern, into a stream (or layered structure) of tokens (where each token may have an associated token "type").

Next, extraction criteria are used to extract one or more data items from the token stream or structure, where the extraction criteria are processed according to the organizing pattern to extract one or more tokens (or nodes from a layered structure). For position-based data, the token(s) at the position(s) identified by the extraction criteria are extracted. For attribute/value-based data, the token(s) and/or node(s) associated with the attribute(s) satisfying the extraction criteria are extracted. For hierarchical/layered data, the token(s) associated with the node(s) matching the extraction criteria are extracted. The extraction criteria may be as simple as an identifier string or may be a query presented to a structured data repository (where the data repository may be organized according to a database schema or data format, such as XML).

The extracted data may be used for further processing by the computing system. For example, the computing system of FIG. 6A, while performing one or more embodiments of the disclosure, may perform data comparison. Data comparison may be used to compare two or more data values (e.g., A, B). For example, one or more embodiments may determine whether A>B, A=B, A !=B, A<B, etc. The comparison may be performed by submitting A, B, and an opcode specifying an operation related to the comparison into an arithmetic logic unit (ALU) (i.e., circuitry that performs arithmetic and/or bitwise logical operations on the two data values). The ALU outputs the numerical result of the operation and/or one or more status flags related to the numerical result. For example, the status flags may indicate whether the numerical result is a positive number, a negative number, zero, etc. By selecting the proper opcode and then reading the numerical results and/or status flags, the comparison may be executed. For example, in order to determine if A>B, B may be subtracted from A (i.e., A—B), and the status flags may be read to determine if the result is positive (i.e., if A>B, then A—B>0). In one or more embodiments, B may be considered a threshold, and A is deemed to satisfy the threshold if A=B or if A>B, as determined using the ALU. In one or more embodiments of the disclosure, A and B may be vectors, and comparing A with B includes comparing the first element of vector A with the first element of vector B, the second element of vector A with the second element of vector B, etc. In one or more embodiments, if A and B are strings, the binary values of the strings may be compared.

The computing system in FIG. 6A may implement and/or be connected to a data repository. For example, one type of data repository is a database. A database is a collection of information configured for ease of data retrieval, modification, re-organization, and deletion. Database Management System (DBMS) is a software application that provides an interface for users to define, create, query, update, or administer databases.

The user, or software application, may submit a statement or query into the DBMS. Then the DBMS interprets the statement. The statement may be a select statement to request information, update statement, create statement, delete statement, etc. Moreover, the statement may include parameters that specify data, or data container (database, table, record, column, view, etc.), identifier(s), conditions (comparison operators), functions (e.g. join, full join, count, average, etc.), sort (e.g. ascending, descending), or others. The DBMS may execute the statement. For example, the DBMS may access a memory buffer, a reference or index a file for read, write, deletion, or any combination thereof, for responding to the statement. The DBMS may load the data from persistent or non-persistent storage and perform computations to respond to the query. The DBMS may return the result(s) to the user or software application.

The computing system of FIG. 6A may include functionality to present raw and/or processed data, such as results of comparisons and other processing. For example, presenting data may be accomplished through various presenting methods. Specifically, data may be presented through a user interface provided by a computing device. The user interface may include a GUI that displays information on a display device, such as a computer monitor or a touchscreen on a handheld computer device. The GUI may include various GUI widgets that organize what data is shown as well as how data is presented to a user. Furthermore, the GUI may present data directly to the user, e.g., data presented as actual data values through text, or rendered by the computing device into a visual representation of the data, such as through visualizing a data model.

For example, a GUI may first obtain a notification from a software application requesting that a particular data object be presented within the GUI. Next, the GUI may determine a data object type associated with the particular data object, e.g., by obtaining data from a data attribute within the data object that identifies the data object type. Then, the GUI may determine any rules designated for displaying that data object type, e.g., rules specified by a software framework for a data object class or according to any local parameters defined by the GUI for presenting that data object type. Finally, the GUI may obtain data values from the particular data object and render a visual representation of the data values within a display device according to the designated rules for that data object type.

Data may also be presented through various audio methods. In particular, data may be rendered into an audio format and presented as sound through one or more speakers operably connected to a computing device.

Data may also be presented to a user through haptic methods. For example, haptic methods may include vibrations or other physical signals generated by the computing system. For example, data may be presented to a user using a vibration generated by a handheld computer device with a predefined duration and intensity of the vibration to communicate the data.

The above description of functions presents only a few examples of functions performed by the computing system of FIG. 6A and the nodes and/or client device in FIG. 6B. Other functions may be performed using one or more embodiments of the disclosure.

While the disclosure has been described with respect to a limited number of embodiments, those skilled in the art, having benefit of this disclosure, will appreciate that other embodiments can be devised which do not depart from the scope of the disclosure as disclosed herein. Accordingly, the scope of the disclosure should be limited only by the attached claims.

Although the preceding description has been described herein with reference to particular means, materials and embodiments, it is not intended to be limited to the particulars disclosed herein; rather, it extends to all functionally equivalent structures, methods and uses, such as are within the scope of the appended claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112(f) for any limitations of any of the claims herein, except for those in which the claim expressly uses the words 'means for' together with an associated function.

What is claimed is:

1. A method, comprising:
    obtaining, by a computer processor, first acquired well data from a well database, the first acquired well data comprising a first gamma ray (GR) log for an interval of interest within a wellbore;
    adjusting, by the computer processor, the first GR log by inserting first predetermined noise into the first GR log to generate a first augmented GR log, wherein the first predetermined noise is based on a predetermined amount of feldspars, micas, or glauconite within a formation within the interval of interest;
    generating, by the computer processor, first augmented well data based on the first acquired well data, wherein the first augmented well data is generated using at least one geological factor and at least one drilling factor, and
    wherein the first augmented well data comprise the first augmented GR log;
    generating, by the computer processor, second augmented well data using second acquired well data from the well database and a smoothing operation, a cut operation, a random deformation operation, a random shift operation, or a random null value operation;
    generating, by the computer processor, a training dataset comprising first non-predicted well data, second non-predicted well data, a first portion of the first acquired well data, the first augmented well data, and the second augmented well data;
    generating, by the computer processor, first predicted well data using a model and the training dataset in a first machine-learning epoch, wherein the model is selected from a group consisting of a convolutional neural network, a deep neural network, a support vector machine, and a supervised learning model;
    determining, by the computer processor, whether the model satisfies a predetermined level of accuracy based on a first comparison between the first predicted well data and the first non-predicted well data;
    updating, by the computer processor, the model using a machine-learning algorithm to produce an updated model in response to the model failing to satisfy the predetermined level of accuracy;
    generating, by the computer processor, second predicted well data using the updated model and the training dataset in a second machine-learning epoch;
    determining, by the computer processor, whether the updated model satisfies the predetermined level of accuracy based on a second comparison between the second predicted well data and the second non-predicted well data; and
    generating, by the computer processor, third predicted well data for a region of interest using the updated model and third acquired well data in response to the updated model satisfying the predetermined level of accuracy.

2. The method of claim 1, further comprising:
    obtaining fourth acquired well data regarding a single rock facies within a formation;
    adjusting the fourth acquired well data using a predetermined deformation operation to generate second augmented well data, wherein the predetermined deformation operation corresponds to a plurality of rock facies with different spatial and lateral changes from the single rock facies, and
    wherein the second augmented well data is used to train the model.

3. The method of claim 1,
    wherein the at least one geological factor comprises one or more of the following:
    a difference in thickness of a subsurface layer due to compaction, expansion, subsidence, or pinch out;
    a fault within a subsurface layer that induces a change in a well log in response to cementation;
    drilling fluid from a drilling operation in a wellbore is mixed with measured rock in a formation, wherein the drilling fluid has a higher radioactivity level than the measured rock in the formation; and
    an amount of drilling mud between the formation and a gamma ray detector.

4. The method of claim 1, further comprising:
    determining a formation top of a subsurface layer using the updated model and fourth acquired data.

5. The method of claim 1, further comprising:
    determining a predetermined well path for a drill bit through a formation;
    obtaining fourth acquired well data during a geosteering drilling operation based on the predetermined well path; and
    updating the predetermined well path using the model and the fourth acquired well data.

6. The method of claim 1,
wherein the third predicted well data is used to update a structural model of a formation in a subsurface during a drilling operation through the formation.

7. The method of claim 1, further comprising:
obtaining a second gamma ray (GR) log for an interval of interest within the wellbore;
adjusting the second GR log using second predetermined noise to generate a second augmented GR log, wherein the second predetermined noise is based on a predetermined amount of a drilling mud being used during a drilling operation, and
wherein the second augmented GR log is used to train the model.

8. The method of claim 1,
wherein the first acquired well data is obtained by a logging tool measuring an interval of interest in a formation,
wherein the logging tool is disposed in a wellbore within the formation,
wherein a cemented section of the wellbore is disposed between the logging tool and a wall of the formation, and
wherein the at least one drilling factor corresponds to an attenuation in measured values within the first acquired well data in response to the presence of the cemented section.

9. The method of claim 1,
wherein the at least one drilling factor comprises one or more of the following:
a stick-and-slip action resulting in movement of a logging tool being stuck in a wellbore;
a predetermined calibration of the logging tool;
a drilling mud weight within the wellbore; and
a predetermined borehole diameter.

10. A system, comprising:
a drilling system coupled to a wellbore in a formation, wherein the wellbore comprises a cemented section;
a gamma ray (GR) logging tool disposed inside the wellbore;
a logging system coupled to a plurality of logging tools;
a simulator comprising a computer processor, wherein the simulator is coupled to the logging system, the drilling system, and the GR logging tool, and wherein the simulator is configured to perform a method comprising:
obtaining first acquired well data from a well database, the first acquired well data comprising a GR log for an interval of interest within the wellbore;
adjusting the GR log by inserting predetermined noise into the GR log to generate an augmented GR log, wherein the predetermined noise is based on a predetermined amount of feldspars, micas, or glauconite within a formation within the interval of interest;
generating first augmented well data based on the first acquired well data, wherein the first augmented well data is generated using at least one geological factor and at least one drilling factor, and
wherein the first augmented well data comprise the augmented GR log;
generating second augmented well data using second acquired well data from the well database and a smoothing operation, a cut operation, a random deformation operation, a random shift operation, or a random null value operation;
generating a training dataset comprising first non-predicted well data, second non-predicted well data, a first portion of the first acquired well data, the first augmented well data, and the second augmented well data;
generating first predicted well data using a model and the training dataset in a first machine-learning epoch, wherein the model is selected from a group consisting of a convolutional neural network, a deep neural network, a support vector machine, and a supervised learning model;
determining whether the model satisfies a predetermined level of accuracy based on a first comparison between the first predicted well data and the first non-predicted well data;
updating the model using a machine-learning algorithm to produce an updated model in response to the model failing to satisfy the predetermined level of accuracy;
generating second predicted well data using the updated model and the training dataset in a second machine-learning epoch;
determining whether the updated model satisfies the predetermined level of accuracy based on a second comparison between the second predicted well data and the second non-predicted well data; and
generating third predicted well data for a region of interest using the updated model and third acquired well data in response to the updated model satisfying the predetermined level of accuracy.

11. The system of claim 10, wherein the simulator is further configured to:
obtain fourth acquired well data regarding a single rock facies within a formation;
adjust the fourth acquired well data using a predetermined deformation operation to generate second augmented well data, wherein the predetermined deformation operation corresponds to a plurality of rock facies with different spatial and lateral changes from the single rock facies, and
wherein the second augmented well data is used to train the model.

12. The system of claim 10, wherein the simulator is further configured to:
determine a formation top of a subsurface layer using the updated model and fourth acquired data.

13. The system of claim 10, further comprising:
a control system for the drilling system, the control system coupled to the logging system and the simulator,
wherein the control system is configured to determine a predetermined well path for a drill bit through a formation,
wherein the control system is configured to update the predetermined well path using the updated model and the third acquired well data.

14. A non-transitory computer readable medium storing instructions executable by a computer processor, the instructions being configured to perform a method comprising:
obtaining first acquired well data from a well database, the first acquired well data comprising a gamma ray (GR) log for an interval of interest within a wellbore;
adjusting the GR log by inserting predetermined noise into the GR log to generate an augmented GR log, wherein the predetermined noise is based on a predetermined amount of feldspars, micas, or glauconite within a formation within the interval of interest;
generating first augmented well data based on the first acquired well data, wherein the first augmented well data is generated using at least one geological factor and at least one drilling factor, and wherein the first augmented well data comprise the augmented GR log;

generating second augmented well data using second acquired well data from the well database and a smoothing operation, a cut operation, a random deformation operation, a random shift operation, or a random null value operation;

generating a training dataset comprising first non-predicted well data, second non-predicted well data, a first portion of the first acquired well data, the first augmented well data, and the second augmented well data;

generating first predicted well data using a model and the training dataset in a first machine-learning epoch, wherein the model is selected from a group consisting of a convolutional neural network, a deep neural network, a support vector machine, and a supervised learning model;

determining whether the model satisfies a predetermined level of accuracy based on a first comparison between the first predicted well data and the first non-predicted well data;

updating the model using a machine-learning algorithm to produce an updated model in response to the model failing to satisfy the predetermined level of accuracy;

generating second predicted well data using the updated model and the training dataset in a second machine-learning epoch;

determining whether the updated model satisfies the predetermined level of accuracy based on a second comparison between the second predicted well data and the second non-predicted well data; and generating third predicted well data for a region of interest using the updated model and third acquired well data in response to the updated model satisfying the predetermined level of accuracy.

15. The non-transitory computer readable medium of claim 14, wherein the method further comprises:

obtaining third acquired well data regarding a single rock facies within a formation;

adjusting the third acquired well data using a predetermined deformation operation to generate second augmented well data, wherein the predetermined deformation corresponds to a plurality of rock facies with different spatial and lateral changes from the single rock facies, and wherein the second augmented well data is used to train the model.

16. The non-transitory computer readable medium of claim 14, wherein the at least one geological factor comprises one or more of the following:
  a difference in thickness of a subsurface layer due to compaction, expansion, subsidence, or pinch out;
  a fault within a subsurface layer that induces a change in a well log in response to cementation;
  drilling fluid from a drilling operation in a wellbore is mixed with measured rock in a formation, wherein the drilling fluid has a higher radioactivity level than the measured rock in the formation; and
  an amount of drilling mud between the formation and a gamma ray detector.

17. The non-transitory computer readable medium of claim 14, wherein the at least one drilling factor comprises one or more of the following:
  a stick-and-slip action resulting in movement of a logging tool being stuck in a wellbore;
  a predetermined calibration of the logging tool;
  a drilling mud weight within the wellbore; and
  a predetermined borehole diameter.

* * * * *